United States Patent
Chauhan et al.

(10) Patent No.: US 10,943,037 B2
(45) Date of Patent: Mar. 9, 2021

(54) GENERATING A CAD MODEL FROM A FINITE ELEMENT MESH

(71) Applicant: Dassault Systemes Simulia Corp., Johnston, RI (US)

(72) Inventors: Manish Chauhan, Pune (IN); Dhiraj Nahar, Pune (IN); Sumit Pal, Pune (IN); Sameer Shah, Pune (IN)

(73) Assignee: DASSAULT SYSTEMES SIMULIA CORP., Johnston, RI (US)

( * ) Notice: Subject to any disclaimer, the term of this patent is extended or adjusted under 35 U.S.C. 154(b) by 916 days.

(21) Appl. No.: 14/765,425

(22) PCT Filed: Apr. 30, 2013

(86) PCT No.: PCT/IB2013/053401
§ 371 (c)(1),
(2) Date: Aug. 3, 2015

(87) PCT Pub. No.: WO2014/177906
PCT Pub. Date: Nov. 6, 2014

(65) Prior Publication Data
US 2016/0042106 A1    Feb. 11, 2016

(51) Int. Cl.
*G06F 30/23* (2020.01)
(52) U.S. Cl.
CPC .................. *G06F 30/23* (2020.01)
(58) Field of Classification Search
CPC .............. G06F 17/5018; G06F 30/00
See application file for complete search history.

(56) References Cited

U.S. PATENT DOCUMENTS

| | | | | |
|---|---|---|---|---|
| 2001/0056339 A1* | 12/2001 | Robinson | ........... | E21B 49/00 703/10 |
| 2002/0041285 A1* | 4/2002 | Hunter | ........... | G06T 3/0093 345/474 |
| 2002/0072883 A1* | 6/2002 | Lim | ........... | G06F 17/10 703/2 |
| 2005/0128198 A1* | 6/2005 | Kim | ........... | G06T 17/20 345/423 |

(Continued)

FOREIGN PATENT DOCUMENTS

WO    WO 2014/177906 A1    11/2014

OTHER PUBLICATIONS

Your Dictionary, Analytical dictionary definition, 2018, Your Dictionary, pp. 1-3 (Year: 2018).*

(Continued)

*Primary Examiner* — Omar F Fernandez Rivas
*Assistant Examiner* — Bernard E Cothran
(74) *Attorney, Agent, or Firm* — Hamilton, Brook, Smith & Reynolds, P.C.

(57) ABSTRACT

The present invention relates to a method and corresponding system for generating a computer-aided design (CAD) model from a finite element mesh. The method of the invention begins with selecting one or more mesh-element-faces on a finite element mesh that represents a geometric object to be formed of one or more geometric faces. Next, from the one or more selected mesh-element-faces, respective geometric faces are generated. Finally, any generated geometric faces are stitched together to make a geometric shell of the geometric object that the finite element mesh represents.

20 Claims, 11 Drawing Sheets

(56) References Cited

U.S. PATENT DOCUMENTS

| | | | | |
|---|---|---|---|---|
| 2006/0054774 | A1* | 3/2006 | Yassour | F16C 32/06 248/631 |
| 2006/0100502 | A1* | 5/2006 | Chen | A61B 5/02007 600/419 |
| 2011/0074769 | A1* | 3/2011 | Takayama | A63F 13/5258 345/419 |
| 2011/0298799 | A1* | 12/2011 | Mariani | G06K 9/00221 345/420 |

OTHER PUBLICATIONS

Hofer, M., et al., "3D shape recognition and reconstruction based on line element geometry," *Industrial Geometry*, 8 pages (2005).

Krysl, Petr, et al., "Extraction of boundary representation from surface triangulations," *Int'l. J. for Numerical Meths. in Engineering*, vol. 50, pp. 1737-1758 (2001).

Lee, S., et al., "Scattered Data Interpolation with Multilevel B-Splines," *IEEE Trans. Visualization & Computer Graphics*, vol. 3, No. 3, pp. 228-244 (1997).

Louhichi, B., et al., "Reconstruction of a CAD model from a deformed mesh," *Mecanique et Industries*, Elsevier, Paris, 10(6):477-486 (2009). English translation provided.

Lukacs, G., et al., "Geometric least-squares fitting of spheres, cylinders, cones and tori," *Dept. of Computer Science University of Wales, Cardiff*, 20 pages (1997).

Notification of Transmittal of the International Search Report and the Written Opinion of the International Searching Authority, or The Declaration, "Generating A CAD Model From A Finite Element Mesh", PCT/IB 2013/053401, dated Jan. 23, 2014.

Odehnal, B., et al., "Equiform Kinematics and the Geometry of Line Elements," Industrial Geometry, 15 pages, (2005).

Owen, Steven, J., et al., "Mesh-based geometry", *Int'l. J. for Numerical Meths. in Engineering*, 58(2):375-395 (2003).

Pottmann, H., et al., *Computational Line Geometry*, Springer (2001).

Taubin, G., "Nonplanar Curve and Surface Estimation in 3-Space", *IEEE Int'l Conf. on Robotics & Automation*, vol. 1, pp. 644-645 (1988).

\* cited by examiner

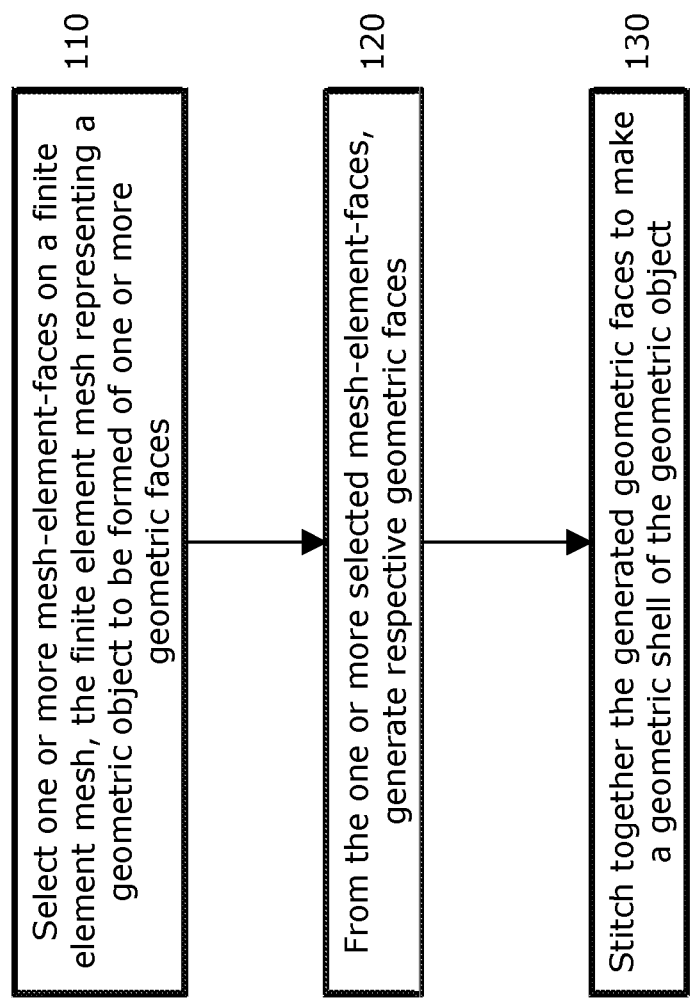

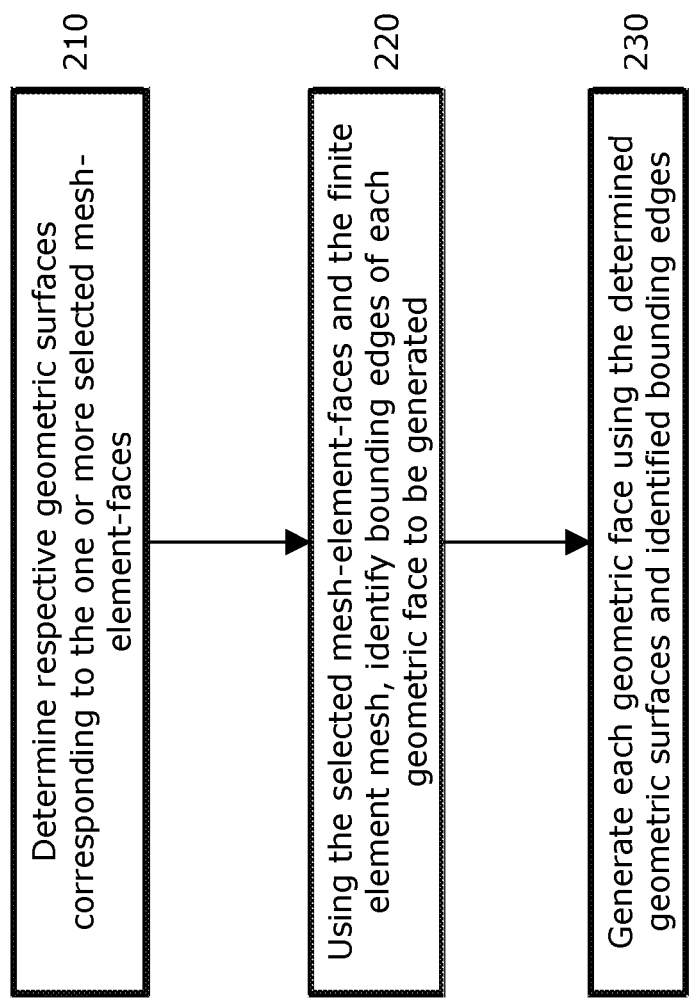
Figure: 2

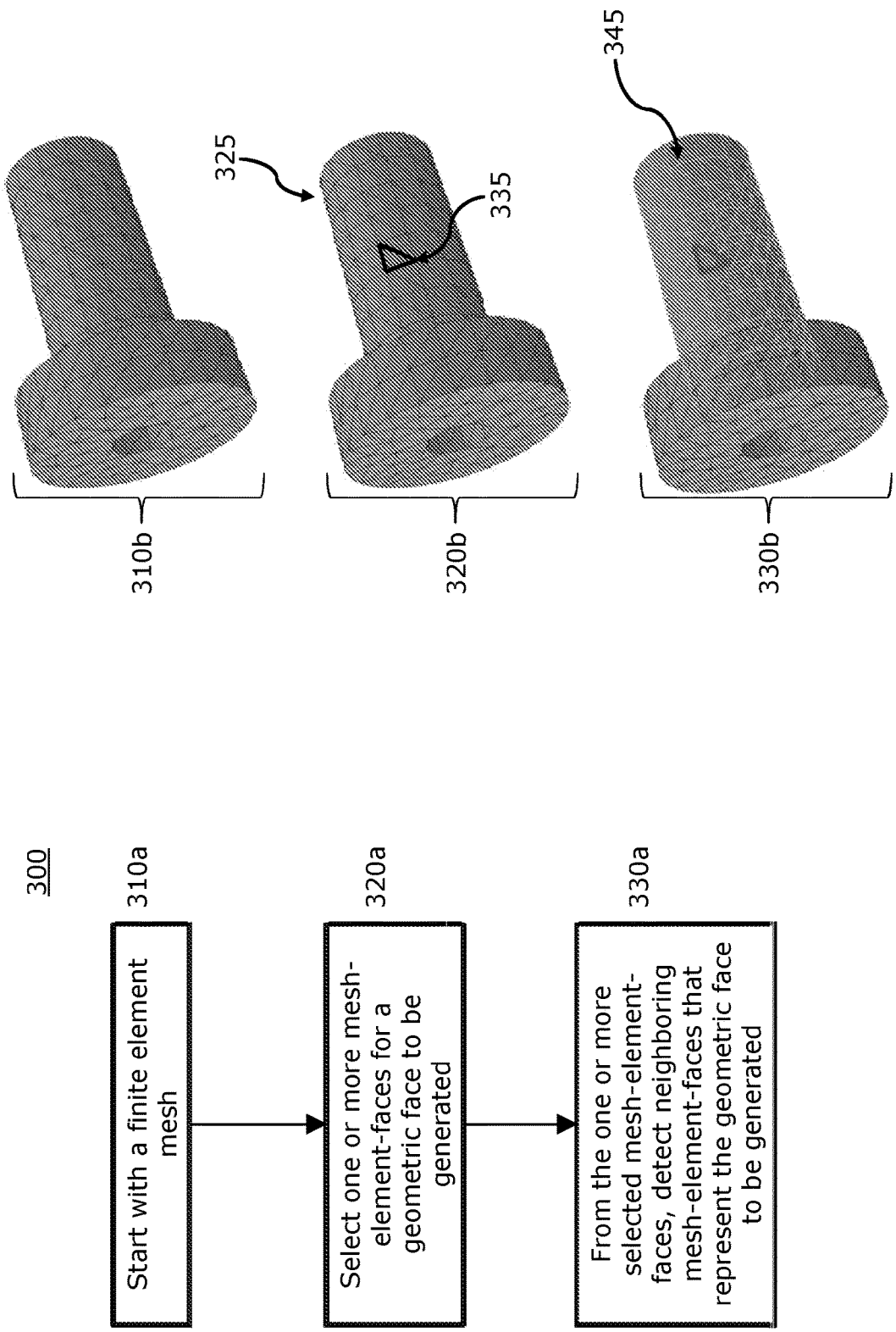

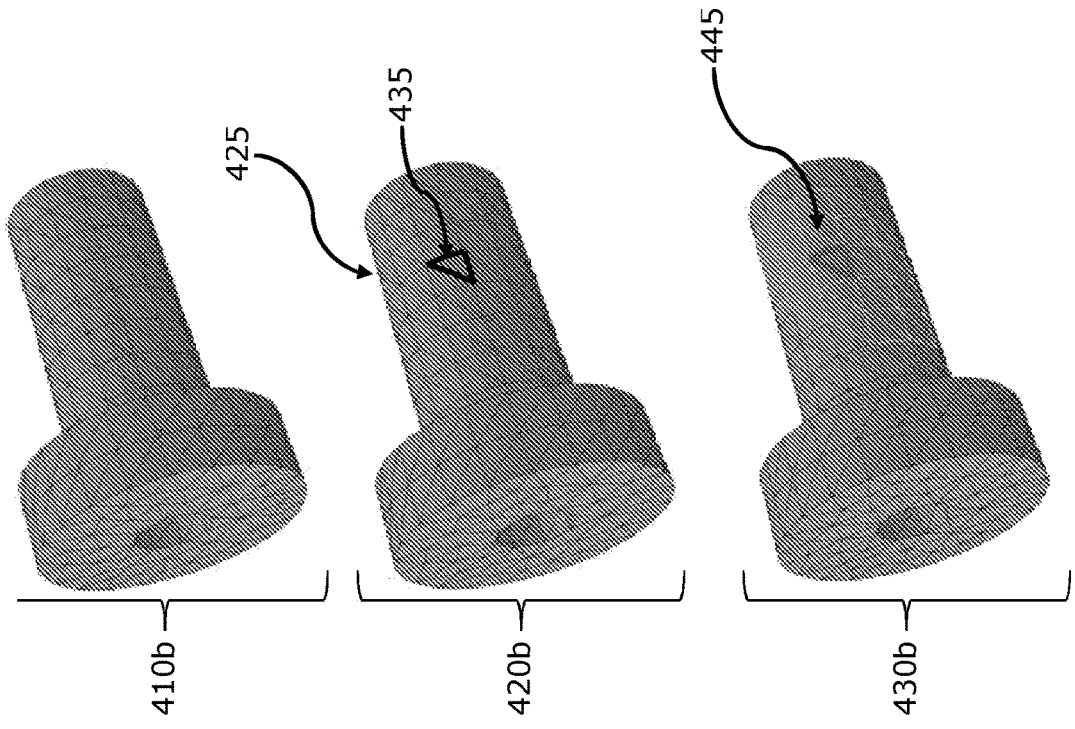
Figure: 4B
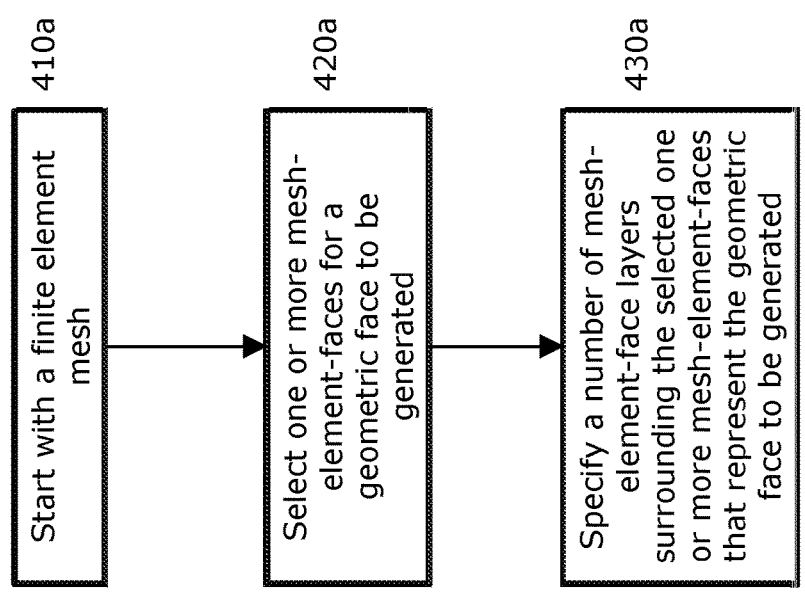
Figure: 4A

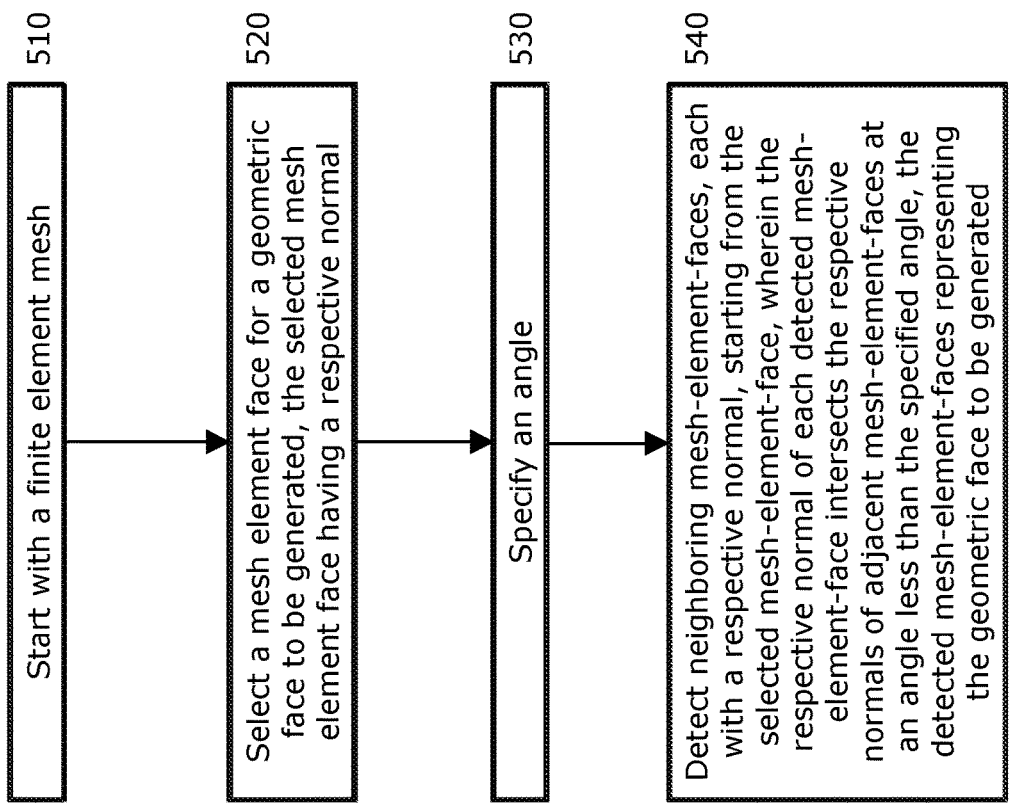
Figure: 5

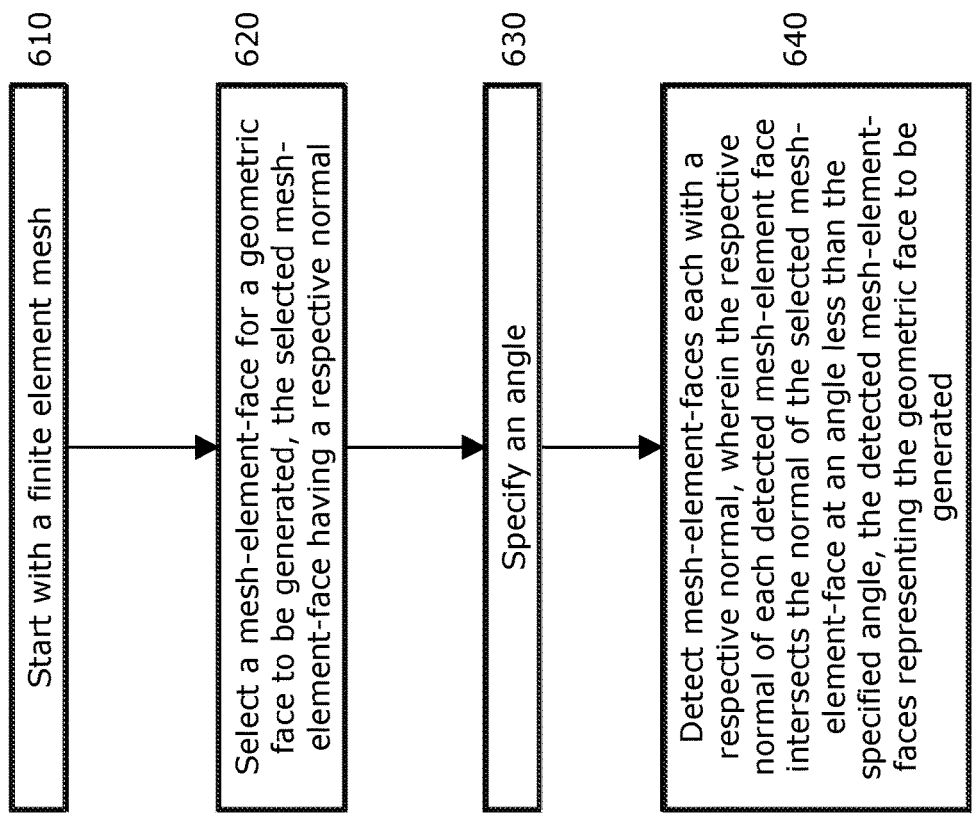
Figure: 6

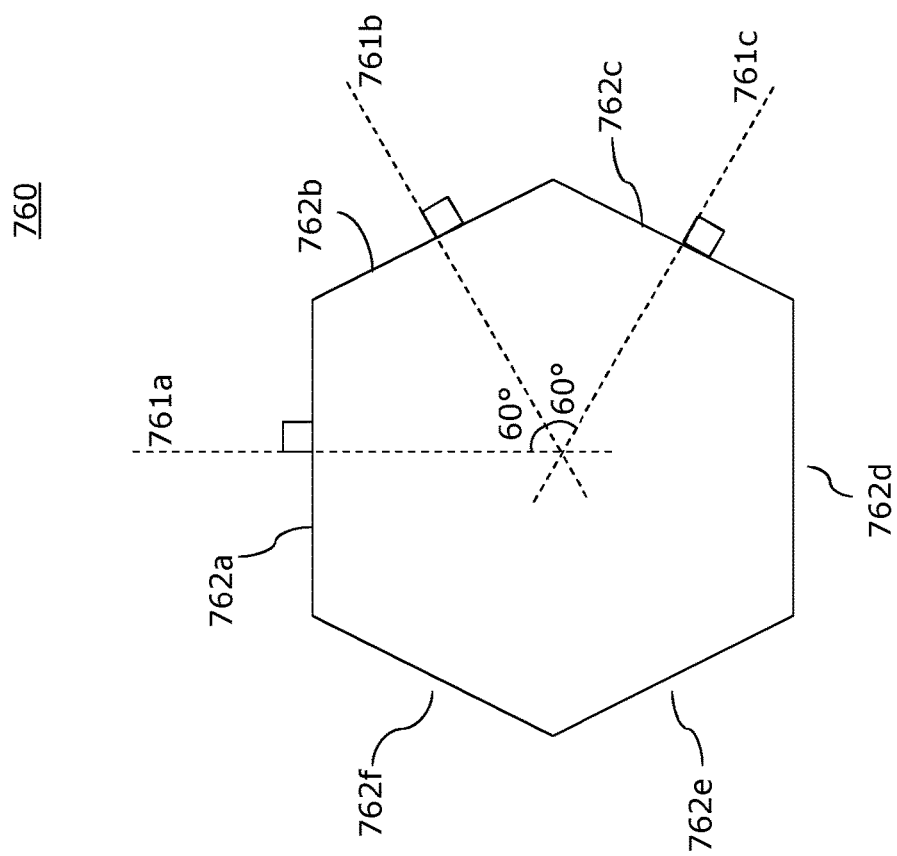
Figure: 7

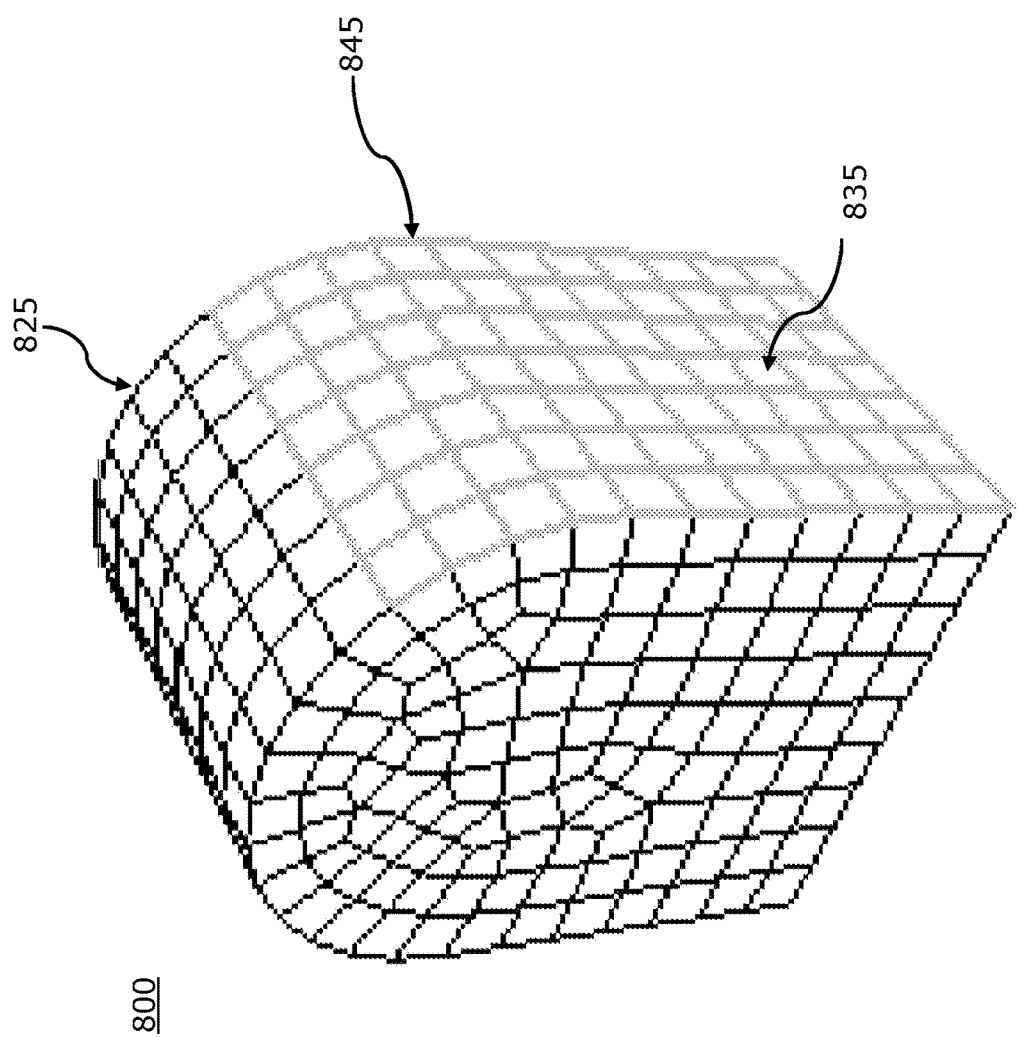
Figure: 8

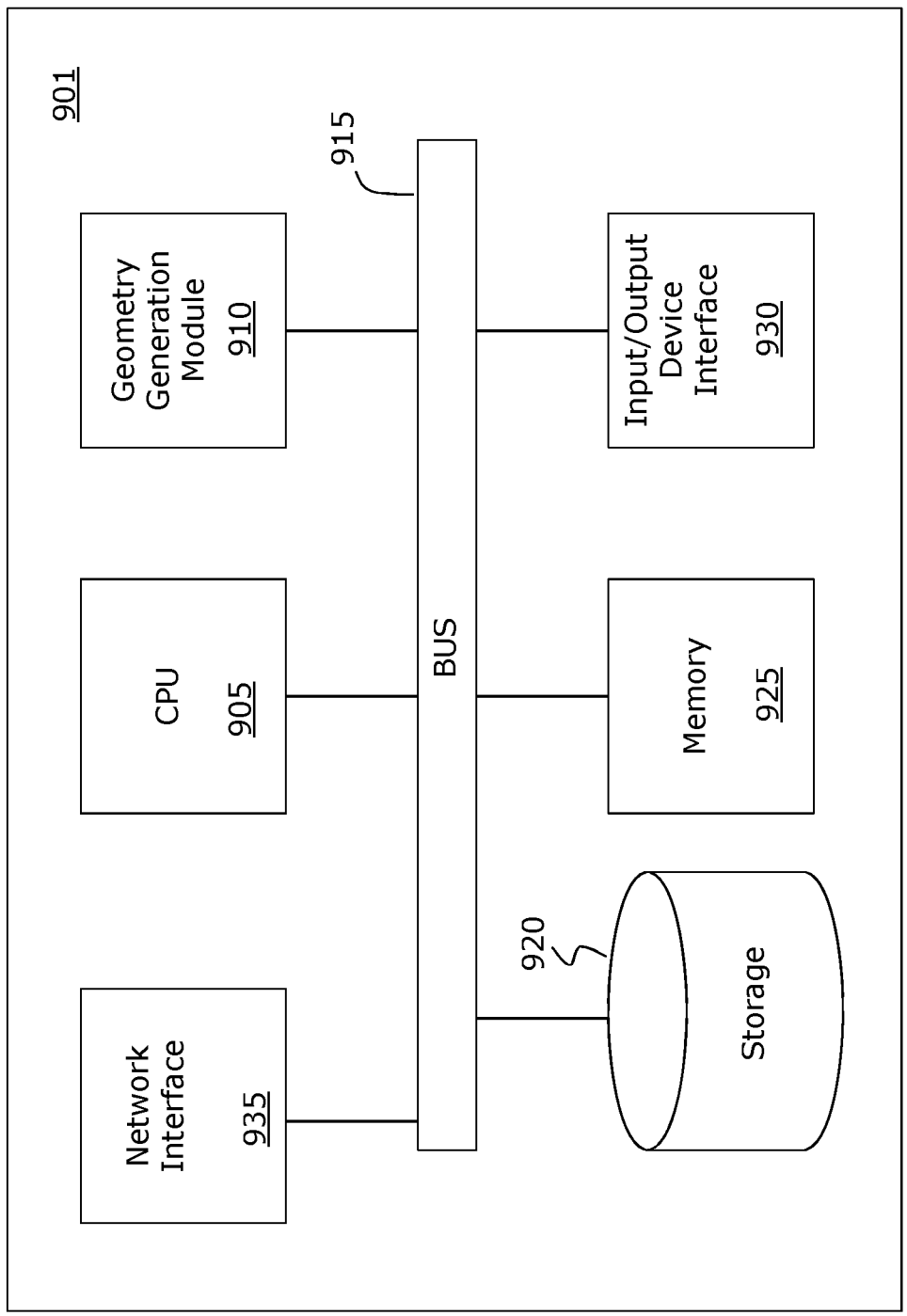
Figure: 9

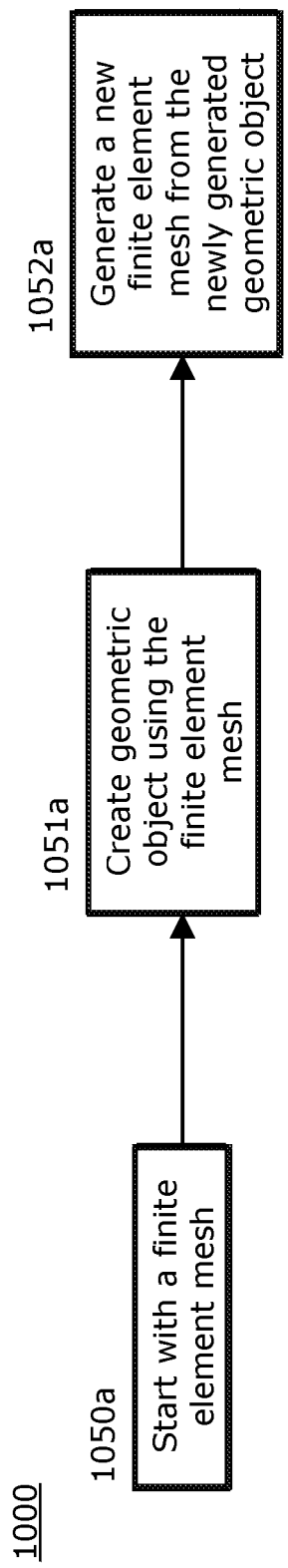
Figure: 10A
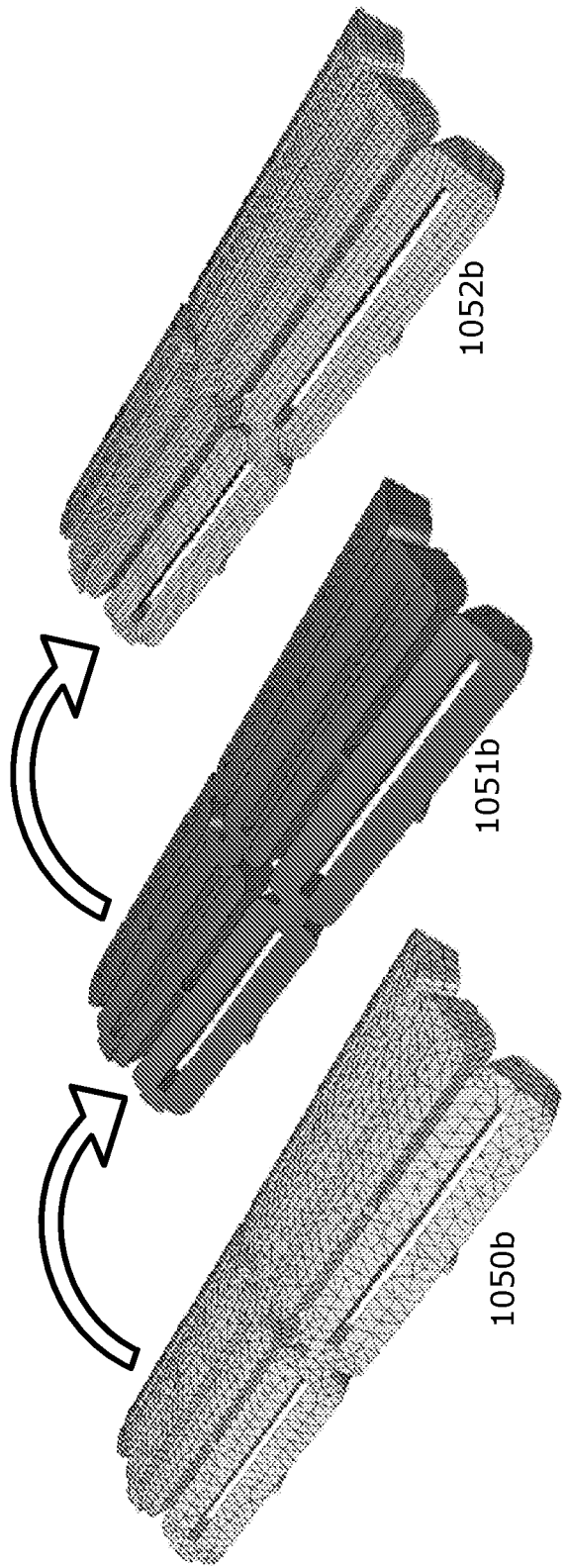
Figure: 10B

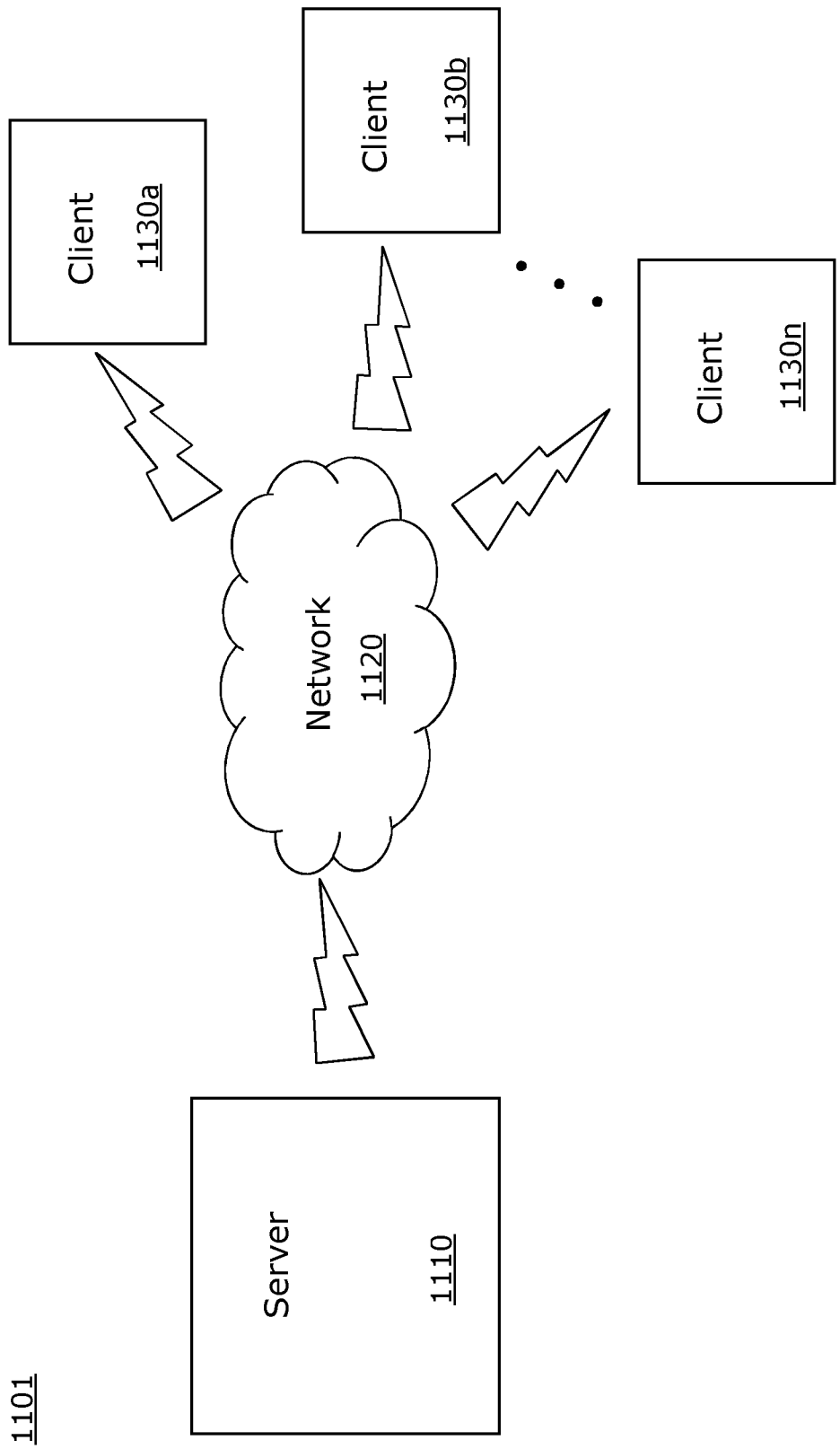
Figure: 11

GENERATING A CAD MODEL FROM A FINITE ELEMENT MESH

RELATED APPLICATION(S)

This application is the U.S. National Stage of International Application No. PCT/IB2013/053401, filed Apr. 30, 2013, which designates the U.S., published in English. The entire teachings of the above application are incorporated herein by reference.

BACKGROUND OF THE INVENTION

The invention generally relates to the field of computer programs and systems, and specifically to the field of computer-aided design (CAD), computer-aided engineering (CAE), modeling, and simulation.

A number of systems and programs are offered on the market for the design of parts or assemblies of parts, such as those provided under the trademark CATIA® and provided by Dassault Systemes, S.A. These so called CAD systems allow a user to construct and manipulate complex three-dimensional (3D) models of objects or assemblies of objects. CAD systems thus provide a representation of modeled objects using edges or lines, in certain cases with faces. Lines or edges may be represented in various manners, e.g. non-uniform rational basis-splines (NURBS).

These CAD systems manage parts or assemblies of parts of modeled objects, which are mainly specifications of geometry. In particular, CAD files contain specifications, from which geometry is generated. From geometry, a representation is generated. Specifications, geometry, and representations may be stored in a single CAD file or multiple CAD files. CAD systems include graphic tools for representing the modeled objects to the designers; these tools are dedicated to the display of complex objects—the typical size of a file representing an object in a CAD system ranges, but is typically on the Mega-byte order of magnitude for a part. An assembly may contain thousands of parts, and an assembly file is correspondingly large. A CAD system manages models of objects, which are stored in electronic files.

SUMMARY OF THE INVENTION

A method and corresponding system, according to an embodiment of the present invention are directed to generating a CAD model of a geometric object, more specifically generating a geometric model from a finite element mesh. An embodiment of the invention begins with selecting one or more mesh-element-faces on a finite element mesh that represents a geometric object to be formed of one or more geometric faces. Next, from the selected mesh-element-faces respective geometric faces are generated. Finally, any generated geometric faces are stitched together to make a shell of the geometric object.

Additionally, the generated geometric shell can be converted to a solid geometric model. If so desired, this generated solid geometric model or the geometric shell can be used to generate a new finite element mesh. Such, an operation is advantageous for simulation and optimization applications. An additional embodiment of the present invention further includes importing the finite element mesh.

Another embodiment of the invention is directed to a system for generating a CAD model from a finite element mesh. The system comprises an interface configured to allow a user to select one or more mesh-element-faces on a finite element mesh that represents a geometric object to be formed of one or more geometric faces. The system further comprises a geometry generation module configured to generate respective geometric faces from the one or more selected mesh-element-faces. The geometry generation module is further configured to stitch together the generated geometric faces to make a geometric shell of the geometric object.

Yet another embodiment of the present invention is directed to a cloud computing implementation for generating a CAD model from a finite element mesh. Such an embodiment is directed to a computer program product executed by a server in communication across a network with one or more clients. The computer program product comprises a computer readable medium which comprises program instructions which, when executed by a processor causes selecting one or more mesh-element-faces on a finite element mesh representing an object to be formed of one or more geometric faces, generating respective geometric faces from the one or more selected mesh-element-faces, and stitching together the generated geometric faces to make a geometric shell of the geometric object.

According to an embodiment of the present invention generating geometric faces may comprise, determining respective geometric surfaces corresponding to the one or more selected mesh-element-faces, identifying bounding edges of each geometric face to be generated using the selected mesh-element-faces, and generating the geometric faces using the determined geometric surfaces and identified bounding edges. In an embodiment, the bounding edges are identified using the selected mesh-element-faces and the finite element mesh. In an example embodiment, the determined geometric surfaces are either non-analytical geometric surfaces or analytical geometric surfaces. Examples of analytical geometric surfaces include a plane, a cone, a cylinder, a sphere, and a torus.

An embodiment of the invention comprises selecting one or mesh-element-faces for a geometric face to be generated and from the one or more selected mesh-element-faces detecting neighboring mesh-element-faces that represent the geometric face to be generated. In an alternative embodiment of the invention, selecting one or more mesh-element-faces includes selecting one or more mesh-element-faces for a geometric face to be generated and further specifying a number of mesh-element-face layers surrounding the one or more selected mesh-element-faces that represent the geometric face to be generated.

According to another embodiment of the invention, selecting mesh-element-faces comprises selecting a mesh-element-face for a geometric face to be generated where the selected mesh-element-face has a respective normal. Such an embodiment further includes specifying an angle and detecting neighboring mesh-element-faces, each with a respective normal, starting from the selected mesh-element-face, wherein the respective normal of each detected mesh-element-face intersects the respective normal of adjacent mesh-element-faces at an angle less than the specified angle, the detected mesh-element-faces representing the geometric face to be generated.

Yet another embodiment of the invention comprises selecting a mesh-element-face for a geometric face to be generated, the selected mesh-element-face having a respective normal, and specifying an angle. Such an embodiment further comprises detecting mesh-element-faces each with a respective normal, wherein the respective normal of each detected mesh-element-face intersects the normal of the selected mesh-element-face at an angle less than the specified angle, the detected mesh-element-faces representing the geometric face to be generated.

In yet another embodiment of the invention, selecting the one or more mesh-element-faces on the finite element mesh comprises selecting a node, an edge, and/or a mesh-element-face.

Embodiments of the present invention address the shortcomings of the prior art.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 1 is a flow chart depicting a method of generating a computer-aided design (CAD) model from a finite element mesh according to principles of the present invention.

FIG. 2 is a flow chart of a method of generating geometric faces according to an embodiment of the present invention.

FIG. 3A is a flow chart depicting a procedure for selecting mesh-element-faces that may be utilized in an embodiment of the invention.

FIG. 3B depicts a finite element mesh at various stages of mesh-element-face selection according to the procedure of FIG. 3A.

FIG. 4A is a flow chart depicting a procedure for selecting mesh-element-faces that may be utilized in an embodiment of the present invention.

FIG. 4B depicts a finite element mesh at various stages of mesh-element-face selection according to the procedure of FIG. 4A.

FIG. 5 is a flow chart depicting a procedure for selecting mesh-element-faces that may be utilized in an embodiment of the invention.

FIG. 6 is a flow chart depicting a procedure for selecting mesh-element-faces according to principles of the present invention.

FIG. 7 illustrates mesh-element-face selection according to embodiments of the invention.

FIG. 8 depicts a finite element mesh where mesh-element-faces have been selected according to principles of an embodiment of the present invention.

FIG. 9 is a simplified block diagram of a system for generating a CAD model from a finite element mesh.

FIG. 10A is a flow chart depicting a procedure for generating a finite element mesh according to an embodiment of the invention.

FIG. 10B illustrates the stages of generating a finite element mesh according to the procedure of FIG. 10A.

FIG. 11 is a simplified diagram of a computer system in which an embodiment of the present invention may be embodied.

DETAILED DESCRIPTION OF THE INVENTION

The advent of CAD and CAE systems allows for a wide range of representation possibilities for objects. One such representation is a finite element mesh. A finite element mesh is a system of points called nodes which are interconnected to make a grid, referred to as a mesh. The mesh may be programmed in such a way that the mesh has the properties of the underlying object that it represents. When a mesh is programmed in such a way, it may be used to perform simulations of the object that it represents. For example, a finite element mesh may be used to represent the interior cavity of a vehicle, the acoustic fluid surrounding a fluid structure, and any number of real world objects, including medical devices such as stents. When a given mesh represents an object and is programmed accordingly it may be used to simulate the real world object itself. For example, a mesh representing a stent may be used to simulate the use of the stent in a real life medical setting.

When a finite element mesh is used in simulation, the mesh itself is often distorted and deformed, and thus, is no longer an accurate representation of the underlying object. Furthermore, a simulation oftentimes occurs in stages, because of this, a mesh can be distorted to a point where the next stage cannot proceed. In such a case, for the simulation to proceed, a model of the underlying object that the deformed mesh represents must be generated, and from the newly generated model, a corresponding new finite element mesh is generated. Simulation can then proceed with the new finite element mesh. This is one such example where a CAD model must be generated from a finite element mesh.

Finite element meshes are regularly used for optimization studies. Once an optimized finite element mesh is determined it can then be given as feedback to the CAD designer so that the underlying CAD model can be generated.

Another scenario where it is beneficial to generate a CAD model from a finite element mesh arises where the finite element mesh is legacy data. In some cases, old archived mesh files may be the only representation of the model available. This may be due to unavailability of the CAD data or geometry formats becoming obsolete. Furthermore, in some scenarios, design changes to the finite element mesh are desired but making the modifications to the mesh itself may be impractical or extremely tedious. Instead, simply generating the underlying geometry and modifying said geometry makes for a far more effective editing process.

Outlined above are some examples among others where it is beneficial to generate a CAD model from existing point data, such as a finite element mesh. While solutions exist for this process, the existing solutions have significant drawbacks that make them undesirable.

For example, some existing tools take only a cloud of points or scanned data as the input, rather than a finite element mesh. Using a cloud of points requires an extensive amount of pre-processing to determine the interior and exterior points. Furthermore, with a cloud of points, the entire topology information is lost—thus, the context is lost, unlike with a finite element mesh where the topology information is intact and the connectivity of mesh elements is known. A cloud of points requires extensive processing to determine connectivity information. Another drawback to existing solutions is the inability to efficiently fit a geometric surface to the cloud of points. Often the existing products are not able to identify where multiple surfaces need to be created, instead they attempt to fit a single geometric surface to a large point cloud.

Thus, a method that can efficiently generate a computer-aided design (CAD) model from a finite element mesh is needed. Embodiments of the present invention provide a method and corresponding system whereby a CAD model may be generated from a finite element mesh.

A description of example embodiments of the invention follows.

FIG. 1 is a flow diagram of a method 100 of generating a geometric model from a finite element mesh. The method begins by selecting one or more mesh-element-faces on a finite element mesh that represents a geometric object to be formed of one or more geometric faces (110). The mesh-element-face may be selected according to the methods 300, 400, 500, and/or 600 of FIGS. 3A, 4A, 5 and 6 respectively, which are described hereinbelow. Next, from the one or more selected mesh-element-faces, respective geometric faces are generated (120). For example, the geometric faces may be generated using a geometric modeler, such as the ACTS® geometric modeler provided by Spatial Corporation. Furthermore, the geometric faces may be determined using the method described hereinbelow in relation to FIG. 2. Finally, the generated geometric faces are stitched together to make a geometric shell of the geometric object that the finite element mesh represents (130). The geometric faces may be stitched together using the geometric stitching capability of a geometric modeler as is known in the art.

In addition to the above noted steps, the method 100 may further comprise converting the generated geometric shell into a solid geometric model. Converting the generated geometric shell into a solid geometric model may be accomplished via various ways known in the art. One such way is using a CAE application, such as the Abaqus®/CAE geometric shell to solid conversion functionality, which is provided by Dassault Systemes SIMULIA Corporation.

According to an embodiment of the invention, the generated shell or solid model of the geometric object may be used to create a new finite element mesh as described hereinbelow in relation to FIGS. 10A and 10B. As described above, such an application is beneficial where for example a mesh is deformed to the point where it cannot be used in the next step of a simulation. By generating a new finite element mesh using the newly generated shell or solid model of the geometric object, a user then has a finite element mesh capable of being used in the next step of a simulation process.

FIG. 2 is a flow chart of a method 200 for generating the geometric faces to form the geometric object which is represented by the finite element mesh. The method 200 begins with step 210, determining respective geometric surfaces corresponding to the one or more selected mesh-element-faces. This may include determining respective geometric surfaces using any number of selected mesh-element-faces. For example, according to an embodiment of the invention, a user selects one mesh-element-face for each geometric face to be generated, and other mesh-element-faces that represent the geometric faces to be generated are automatically determined. Next, using the selected mesh-element-faces, the edges (bounding edges) of each geometric face to be generated are identified (220). Finally, each geometric face is generated using the determined geometric surfaces and identified bounding edges (230).

The process 210, of determining respective geometric surfaces corresponding to the one or more selected mesh-element-faces may be accomplished in several ways. One such way is to vary the process based upon the underlying geometric surface that is being determined. Such a method uses one approach to determine analytic geometric surfaces corresponding to the one or more selected mesh-element-faces that represent analytical geometric faces to be generated and another approach for determining the non-analytical geometric surfaces corresponding to the one or more selected mesh-element-faces that represent the non-analytical geometric faces to be generated. The exercise of determining respective geometric surfaces corresponding to the one or more selected mesh-element-faces is an exercise of determining the best fit geometric surface for particular sets of mesh-element-faces. Essentially, for each geometric face of the object to be formed, which is represented by the finite element mesh, a geometric surface that best fits each geometric face to be formed is determined. To note, this approach relies upon determining which type of geometric surface is being determined, i.e., an analytical geometric surface versus a non-analytical geometric surface. This may be accomplished in a variety of ways, for example, it may be determined based upon a user selection and/or may be based upon the quality of the fit that may be achieved.

A multi-step process may be utilized to determine the geometric surfaces corresponding to the one or more selected mesh-element-faces. The process of determining the geometric surfaces corresponding to the one or more selected mesh-element-faces may be done according to principles known in the art.

Firstly, it is noted that analytical geometric surfaces, e.g., planes, cones, cylinders, spheres, and tori, can be given a common representation as surfaces traced by simple analytic planar curves, line or circle, under uniform Euclidean motion, i.e., translation, rotation, or a combination thereof. The analytic geometric surfaces can be generated from more than one combination of analytic planar curves and Euclidean motions. When determining a geometric surface to be used for generating a given geometric face of the object to be formed that the finite element mesh represents, a first analysis is done to determine the number of such possible combinations of analytic planar curves and Euclidean motions that yields candidate geometric surfaces that fit each geometric face to be determined of the object to be formed that the finite element mesh represents. This analysis rules out analytic geometric surfaces that cannot fit the particular geometric faces of the object to be formed that is represented by the finite element mesh for which the corresponding geometric surfaces are being determined.

When determining a given geometric surface, the first problem then is to find two vectors describing uniform Euclidean motion, which induces a velocity field at any position p of the geometric face of the object to be formed for which the geometric surface is being determined. Such a field may be given by the equation:

$$v(p) = \text{linear\_velocity} + \text{angular\_velocity} * p$$

The method used may be as described in Odehnal et al., *Equiform Kinematics and the Geometry of Line Elements*, which is herein incorporated by reference.

Next, using the corresponding mesh node positions and normals we find a velocity field that moves the points along the surface, such a velocity field corresponds to the best fit Euclidean motion to the mesh data. This is a "least squares" fitting problem, analyzing the solutions to the first problem isolates the candidate analytic surface types for the next stage of processing. For this stage of processing such a method may be used as described in Lukacs et al., *Geometric least-squares fitting of spheres, cylinders, cones and tori*, which is herein incorporated by reference.

Such a method essentially seeks to minimize the distance between the nodes of the finite element mesh which represent a given geometric face to be generated and the points on a candidate geometric surface. For example, let $p_i$ for $i=1, \ldots, m$, be the three-dimensional (3-D) points given by the nodes of the finite element mesh. Let us define d as a function of the distance of a point $p_i$ from the candidate geometric surface s. Thus, we search for a surface s that minimizes the distance between the points, $p_i$ for $i=1, \ldots, m$, and the surface s. This may be done by minimizing:

$$\Sigma_{i=1}^{m} d(s, p_i)^2$$

The next stage in the multi-step process of determining a geometric surface for an analytical region of the object to be formed that the finite element mesh represents is to examine the solution described above, which found two vectors describing uniform Euclidean motion, which induces a velocity field at any position p, given by:

$$v(p)=\text{linear\_velocity}+\text{angular\_velocity}*p$$

This solution identifies an axis of rotation or extrusion and this information is used to identify the best fit analytic profile curve (line or circle). This serves to further isolate the best fit analytic geometric surface type.

A finite element mesh may be a coarse approximation of the geometric object that is represents. Thus, the mesh normals do not necessarily match the analytic geometric surface normals, so at this stage of processing we only have an approximation of the best fit analytic geometric surface. With this approximation of the best fit analytic geometric surface, a Netwon-Raphson based solver may then used to converge to the best fit analytic geometric surface.

The above described process is used to determine the best fit geometric surface which is to be used in generating a particular analytic geometric face of an object to be formed which is represented by a finite element mesh. If the finite element mesh represents an object to be formed which comprises multiple analytical geometric faces, then a respective geometric surface may be determined for each geometric face to be determined and thus the process repeated accordingly.

As stated above, the process for determining geometric surfaces uses different approaches for analytical and non-analytical geometric surfaces. Where the underlying geometric surface is non-analytical, a Multi-level B-spline approach may be used. In such an approach, a non-uniform rational basis-spline (NURBS) surface is created for each non-analytical geometric face of the object to be formed which the finite element mesh represents. These NURBS surfaces may be created using any method that is known in the art, such as the Mutli-level B-spline approach that is part of known CAE systems, such as the Abaqus®/CAE functionality provided by Dassault Systemes SIMULIA Corporation. Further, the method used may be as described in Lee et al., *Scattered Data Interpolation with Multilevel B-Splines*, IEEE Transactions on Visualization and Computer Graphics, Vol. 3 No. 3, July-September 1997, which is herein incorporated by reference.

Described above is one method for performing the step 210, determining respective geometric surfaces corresponding to the one or more selected mesh-element-faces, of the method 200. The next step of the method 200 is to identify the bounding edges of each geometric face to be generated (220). According to an embodiment of the present invention, this is done using the selected mesh-element-faces. Based upon the selected mesh-element-faces, the associated boundary mesh-element-face edges are identified as well as finite element mesh nodes with a sharp change in angle from neighboring mesh-element-face edges. At these identified nodes geometric vertices are created. Further, geometric edges are created between every two consecutive geometric vertices. This process is also used in conjunction with geometric objects to be formed that contain such elements as holes and bosses.

Having determined the geometric surfaces and the bounding edges, the next stage of the method 200 is to generate the geometric faces using the determined geometric surfaces and identified bounding edges (230). These geometric surfaces may be created using any method known in the art. For example, the Spatial/ACTS® geometric modeler provided by Spatial Corporation may be used to generate the geometric surfaces.

As described hereinabove, an embodiment of the invention relies upon mesh-element-face selection for geometric face generation. According to an embodiment of the present invention, a user selects mesh-element-faces, and then based upon these selections, corresponding geometric faces are determined. In an embodiment of the invention, a user selects a mesh-element-face and then neighboring mesh-element-faces that represent a geometric face to be generated are automatically determined. In another embodiment, a user selects and/or specifies the mesh-element-faces that represent a given geometric face to be generated. Selecting mesh-element-faces, and determining mesh-element-faces that represent corresponding geometric faces to be generated may be accomplished in a variety of different ways, for example, using a combination of different mesh-element-face selection methods. According to an embodiment of the invention, a user selects which of a variety of mesh-element-face selection methods he or she would like to utilize. The user may then proceed to select mesh-element-faces in accordance with the selected method. These methods may be used to identify particular mesh-element-faces which represent particular geometric faces to be generated in accordance with the methods 100 and 200 described hereinabove. In a further embodiment of the invention, a user may vary the mesh-element-face selection method throughout the process of generating a geometric object from the finite element mesh.

Described hereinbelow in relation to FIGS. 3A-6 are methods of selecting mesh-element-faces according to principles of the present invention.

FIG. 3A is a flowchart depicting a method 300 of mesh-element-face selection. This method illustrates a process to automatically determine a set of mesh-element-faces based on one or more selected mesh-element-faces, such that the automatically determined set of mesh-element-faces represent a respective analytical geometric face of the object to be generated. FIG. 3B depicts a finite element mesh at various stages, 310b, 320b, and 330b, of mesh-element-face selection according to the method 300 of FIG. 3A. The method 300 starts with a finite element mesh 310a, which is depicted as the mesh 310b in FIG. 3B. Next, one or more mesh-element-faces are selected for a geometric face to be generated (320a). For example, given the mesh-element-faces that represent the geometric face 325, one mesh-element-face, such as the mesh-element-face 335 may be selected, as depicted in the mesh 320b. Then, from the selected one or more mesh-element-faces each neighboring mesh-element-face that makes up a geometric face to be generated are detected (330a). The detected neighboring mesh-element-faces that represent the geometric face to be generated are illustrated in FIG. 3B in the mesh 330b as the highlighted mesh-element-faces 345. This method 300 may be repeated for each analytical geometric face of the geometric object to be formed that the finite element mesh represents. Further, the method 300 may be used alone or in combination with other methods of mesh-element-face selection in order to determine the geometric faces of the object to be formed. In this manner, the mesh-element-faces that represent each geometric face may be identified.

FIG. 4A is a flowchart depicting a method 400 of mesh-element-face selection according to an embodiment of the invention. FIG. 4B depicts a finite element mesh, 410b, 420b, and 430b, at various stages of mesh-element-face selection according to the method 400 of FIG. 4A. The method 400 starts with a finite element mesh 410a, which may be represented by the mesh 410b. Next, one or more mesh-element-faces are selected for a geometric face to be generated (420a). For example, given the mesh-element-faces that represent the geometric face to be determined 425, a mesh-element-face, such as the mesh-element-face 435, may be selected. Then, the number of mesh-element-face layers surrounding the selected mesh-element-face that represent the geometric face to be generated is specified (430a). For example, as depicted in the mesh 430b, if the mesh-element-face 435 is selected and the specified number of mesh-element-face layers that represent the geometric face to be generated is 2, such mesh-element-faces include the highlighted mesh-element-faces 445 in the finite element mesh 430b.

FIG. 5 depicts a method 500 of mesh-element-face selection according to an embodiment of the invention, such a method may be referred to as a "pick by angle" method. The method 500 starts with a finite element mesh (510). Next, a mesh-element-face for a geometric face to be generated is selected, the selected mesh-element-face having a respective normal (520). After selecting the mesh-element-face, an angle is specified which is used to determine neighboring mesh-element-faces that represent a given geometric face to be generated. Any angle may be specified, or the angle that may be specified may be restricted to a particular range, such as between 0 and 90 degrees. According to such an embodiment, neighboring mesh-element-faces are detected starting from the selected mesh-element-face, wherein the respective normal of each detected mesh-element-face intersects the respective normals of adjacent mesh-element-faces at an angle less than the specified angle. Thus, according to the operation of such an embodiment, the method starts from the selected mesh-element-face and determines the respective angle of intersection of the normal of the selected mesh-element-face and the normal of any adjacent mesh-element-faces. The method then continues to branch out in all directions and determines the angles of intersection of the normals of adjacent mesh-element-faces. This method continues to branch out and detects neighboring mesh-element-faces where the respective normal of each detected mesh-element-face intersects the respective normal of adjacent mesh-element-faces at an angle less than the specified angle. According to such an embodiment the detected mesh-element-faces represent the geometric face to be generated.

While the method 500 describes selecting mesh-element-faces, other embodiments of the method 500 may operate by selecting a node, an edge, and/or mesh-element-faces of the finite element mesh. For example, in an embodiment of the invention, a group of edges that are connected end-to-end may be determined. In such an embodiment, a given edge is selected and an appropriate angle is specified. Next, starting from the selected edge, the intersection of the normal of the selected edge and any adjacent edges are determined. The method continues and detects edges wherein the angle of intersection of the normals of adjacent edges is less than the specified angle. The method branches out in all directions starting from the selected edge and determines the intersection of the normals of adjacent edges. Such a method may be referred to as a "chain method" as it may be used to find, for example, a series of edges that are connected end-to-end.

FIG. 6 depicts a method 600 of mesh-element-face selection according to principles of the present invention. The method 600 begins with a finite element mesh (610). Then, a mesh-element-face for a geometric face to be generated is selected, the selected mesh-element-face has a respective normal (620). Next, an angle is specified; the specified angle is used to determine the mesh-element-faces that represent the geometric face to be generated. Any angle may be specified, or the angle that may be specified may be restricted to a particular range, such as between 0 and 90 degrees. Further, according to such an embodiment, mesh-element-faces each with a respective normal are detected, wherein the respective normal of each detected mesh-element-face intersects the normal of the selected mesh-element-face at an angle less than the specified angle. In such an embodiment the detected mesh-element-faces represent the geometric face to be generated.

As presented hereinabove, the method 600 begins with selecting a mesh-element-face. Such a selection may be accomplished by selecting a node, an edge, and/or a mesh-element-face of a finite element mesh. Similar to the method 500 of FIG. 5, the method 600 branches out from the selected mesh-element-face, however, instead of detecting mesh-element-faces based upon the intersection of the normals of adjacent mesh-element-faces, the method 600 uses the angle of intersection between the normal of the selected mesh-element-face and other mesh-element-faces.

Described above in relation to FIGS. 3A-6 are various methods of mesh-element-face selection. These various methods of mesh-element-face selection are used to identify sets of mesh-element-faces that represent given geometric faces to be generated. While the methods describe selecting mesh-element-faces, embodiments of the invention may allow for the selection of nodes, edges, and/or mesh-element-faces of a finite element mesh. Further, a mesh-element-face may be selected by selecting a node and/or an edge.

The methods of FIGS. 3A-6 may be used alone or in combination, to identify the mesh-element-faces that represent particular geometric faces of the geometric object to be formed. In an embodiment of the invention, the above described methods are used alone or in combination to identify the mesh-element-faces that represent all of the geometric faces of the object to be formed. In yet another embodiment, the methods described hereinabove are used to determine mesh-element-faces that represent analytic geometric faces of the geometric object to be formed. Thus, these identified mesh-element-faces are used to generate the respective geometric faces according to the principles of the present invention. Further, in yet another embodiment of the invention, a user may select particular mesh-element-faces that represent a geometric face to be generated.

Further still, according to an embodiment of the invention, the mesh-element-faces that represent a given geometric face of the object to be generated are selected, and then a corresponding geometric face is created for these selected mesh-element-faces. In yet another embodiment, the above described methods are used to generate geometric faces for the selected and identified mesh-element-faces and then remaining mesh-element-faces that represent a single non-analytical geometric face are automatically grouped. Further still, in an embodiment of the invention, a non-analytical geometric face may be generated for a subset of mesh-element-faces wherein an analytical geometric surface cannot be fit to the subset of mesh-element-faces within a given tolerance.

Example operation of the methods 500 and 600 are described hereinbelow in relation to FIGS. 7 and 8.

FIG. 7 depicts a simplified two-dimensional (2D) hexagon 760. The hexagon 760, is composed of respective edges 762a-f. FIG. 7 further depicts the respective normals 761a-c of the edges 762a-c. While not shown, all edges 762a-f of the hexagon 760 have respective normals.

An embodiment of the method 500 may be used to determine the edges, 762a-f of the hexagon 760. In such an embodiment of the method 500, one may begin by selecting the edge 762a. Next, an angle greater than 60 degrees may be specified, such as 61 degrees. Then, the method branches out and determines the angle of intersection between the normal 761a of the edge 762a and the normal 761b of the edge 762b. As illustrated in FIG. 7, this angle is 60 degrees, because the specified angle is 61 degrees, the edge 762b would be detected. The method would then continue and determine the angle of intersection between the normal 761b of the edge 762b and the normal 761c of the edge 762c. This angle of intersection is again 60 degrees, and thus this edge 762c, would be detected. This method may continue until all of the edges 762a-f of the hexagon 760 are detected. While described as going in a particular direction, embodiments of the invention may branch out in any and all directions from the selected mesh-element-face.

As described above, according to the mesh-element-face selection method 500 all of the edges 762a-f of the hexagon 760 may be determined, the result however may be different according to the principles of the method 600 of FIG. 6. An embodiment of the method 600 may begin similarly by selecting the edge 762a and specifying an angle of 61 degrees. Again, the angle of intersection between the normal 761a of the edge 762a and the normal 761b of the edge 762b is determined to be 60 degrees, which is less than the specified angle, and the edge 762b is detected. The result of the methods 500 and 600 differs after this point. Next, according to the method 600, the angle of intersection between the normal 761a of the selected edge 762a, and the normal 761c of the edge 762c is determined. This angle is 120 degrees, and thus, the edge 762c would not be grouped with the edges 762a and 762b. Because the method 600 may branch out in all directions from the selected edge, the edge 762f may be detected in a manner similar to the edge 762b.

FIG. 8 depicts a finite element mesh 800 wherein mesh-element-faces have been selected according to principles of the present invention. According to the principles of the method 600 if a vertical mesh-element-face, such as the mesh-element-face 835 is selected, a user may specify an angle such that the mesh-element-faces that represent the geometric face 825 to be generated, or a subset thereof may be detected. For example, if the mesh-element-face 835 is selected, and an angle of 45 degrees is specified, the highlighted mesh-element-faces 845 will be detected, according to the principles of the method 600. If however, an angle of 90 degrees were specified, mesh-element-faces up to the top of the round section of the finite element mesh 800 would be detected and thus highlighted.

On the other hand, if the mesh-element-face 835 was selected according to the principles of the method 500 of FIG. 5 and an angle of 13 degrees was specified, all of the mesh-element-faces representing the geometric face 825 would be detected. This is because the angle of intersection of the normals of the adjacent mesh-element-faces which represent the geometric face 825, are less than 13 degrees. The result would be the same if any mesh-element-face which represents the geometric face 825 was selected, as the method branches out in all directions from the selected mesh-element-face.

FIG. 9 is a high level block diagram of a system 901 that generates a CAD model from a finite element mesh. The system 901 contains a bus 915. The bus 915 is a connection between the various components of the system 901. Connected to the bus 915 is an input/output device interface 930 for connecting various input and output devices, such as a keyboard, mouse, display, speakers, etc. to the system 901. According to an embodiment of the invention, the input/output device interface 930 provides an interface for allowing a user to select mesh-element-faces using any method as in known in the art. In an embodiment of the invention, the input/output device interface 930 allows a user to select the mesh-element-faces using a mouse and a display. In yet another embodiment, the user selects mesh-element-faces via the input/output interface 930 using a touch-screen display. Central processing unit (CPU) 905 is connected to the bus 915 and provides for the execution of computer instructions. Memory 925 provides volatile storage for data used for carrying out computer instructions. Storage 920 provides non-volatile storage for software instructions such as an operating system (not shown). The system 901 also comprises a network interface 935, for connecting to any variety of networks, including wide area networks (WANs) and local area networks (LANs).

Further connected to the system 901 is a geometry generation module 910. The geometry generation module 910 may be configured to generate geometric faces according to the methods described hereinabove. In addition to being configured to generate geometric faces, the geometry generation module 910 may be further configured to stitch together any generated geometric faces to form a geometric shell. According to an alternative embodiment of the invention, the geometry generation module 910 is configured to convert a geometric shell into a solid geometric model.

Another embodiment of the system 901 comprises a mesh generation module (not shown). A mesh generation module may be used to generate a finite element mesh from a generated CAD model, such as a CAD model generated by the geometry generation module 910. The system 901 may further include an import module, used to import a finite element mesh to the system 901. Alternatively, the system 901 may provide for the importation of a finite element mesh via the network interface 935 or the input/output device interface 930. Further, the import module may be embodied in or coupled to the network interface 935 and/or the input/output device interface 930.

FIG. 10A depicts a method 1000 of generating a finite element mesh according to principles of the present invention. FIG. 10B depicts a finite element mesh and geometric model at various stages of the method 1000. The method 1000 begins with a finite element mesh (1050a). This may be depicted as the finite element mesh 1050b. From the finite element mesh, a solid geometric model is generated (1051a). This solid geometric model may be generated using the method 100 described hereinabove in relation to FIG. 1. From this generated solid model a new finite element mesh is generated (1052a). This may be depicted as the finite element mesh 1052b in FIG. 8B.

FIG. 11 illustrates a computer network environment 1101 in which the present invention may be implemented. In the computer network environment 1101, the server 1110 is linked through communications network 1120 to clients 1130a-n. The environment 1101 may be used to allow the clients 1130a-n, alone or in combination with the server 1110, to execute the methods described above.

It should be understood that the example embodiments described above may be implemented in many different ways. In some instances, the various methods and machines described herein may each be implemented by a physical, virtual, or hybrid general purpose computer, or a computer network environment such as the computer environment 1101.

Embodiments or aspects thereof may be implemented in the form of hardware, firmware, or software. If implemented in software the software may be stored on any non-transient computer readable medium that is configured to enable a processor to load the software or subsets of instructions thereof. The processor then executes the instructions and is configured to operate or cause an apparatus to operate in a manner as described herein.

Further, firmware, software, routines, or instructions may be described herein as performing certain actions and/or functions of the data processors. However, it should be appreciated that such descriptions contained herein are merely for convenience and that such actions in fact result from computing devices, processors, controllers, or other devices executing the firmware, software, routines, instructions, etc.

It also should be understood that the flow diagrams, block diagrams, and network diagrams may include more or fewer elements, be arranged differently, or be represented differently. But it further should be understood that certain implementations may dictate the block and network diagrams and the number of block and network diagrams illustrating the execution of the embodiments be implemented in a particular way.

Accordingly, further embodiments may also be implemented in a variety of computer architectures, physical, virtual, cloud computers, and/or some combination thereof, and, thus, the data processors described herein are intended for purposes of illustration only and not as a limitation of the embodiments.

While this invention has been particularly shown and described with references to example embodiments thereof, it will be understood by those skilled in the art that various changes in form and details may be made therein without departing from the scope of the invention encompassed by the appended claims.

The invention claimed is:

1. A computer-based method for generating a computer-aided design (CAD) model of a real-world object from a finite element mesh, the CAD model employed in finite element simulations of the real-world object and the method comprising:
    selecting one mesh-element-face on a finite element mesh for each respective geometric face of a geometric object, the finite element mesh representing the geometric object to be formed of each respective geometric face wherein, the geometric object represents the real-world object and each selected mesh-element-face corresponds to a different respective geometric face of the geometric object and each different respective geometric face is represented by a plurality of respective mesh-element-faces;
    in response to selecting one mesh-element-face for each respective geometric face, generating geometric faces, including, for a given geometric face, detecting the plurality of respective mesh-element-faces that represent the given geometric face to be generated from the selected one mesh-element-face;
    stitching together the generated geometric faces to make a geometric shell of the geometric object representing the real-world object; and
    performing a finite element simulation using the geometric shell to determine behavior of the real-world object; the generating, stitching, and performing being automatically implemented by a processor.

2. The method of claim 1 further comprising:
    converting the geometric shell into a solid geometric model; and
    generating a finite element mesh from the solid geometric model.

3. The method of claim 1 wherein generating the geometric faces comprises:
    determining respective geometric surfaces corresponding to each selected mesh-element-face;
    using each selected mesh-element-face and the finite element mesh, identifying bounding edges of each geometric face to be generated; and
    generating each geometric face using the determined geometric surfaces and identified bounding edges.

4. The method of claim 3 wherein each determined geometric surface is a non-analytical geometric surface or an analytical geometric surface, wherein an analytical geometric surface has a type which is one of: a plane, a cone, a cylinder, a sphere, and a torus.

5. The method of claim 1 further comprising:
    selecting one or more mesh-element-faces for a geometric face to be generated; and
    from the selected one or more mesh-element-faces, detecting neighboring mesh-element-faces that represent the geometric face to be generated.

6. The method of claim 1 further comprising:
    selecting one or more mesh-element-faces for a geometric face to be generated; and
    specifying a number of mesh-element-face layers surrounding the selected one or more mesh-element-faces that represent the geometric face to be generated.

7. The method of claim 1 further comprising:
    selecting a mesh-element-face for a geometric face to be generated, the selected mesh-element-face having a respective normal;
    specifying an angle; and
    detecting neighboring mesh-element-faces, each with a respective normal, starting from the selected mesh-element-face, wherein the respective normal of each detected mesh-element-face intersects the respective normal of adjacent mesh-element-cells at an angle less than the specified angle, the detected mesh-element-faces representing the geometric face to be generated.

8. The method of claim 1 further comprising:
    selecting a mesh-element-face for a geometric face to be generated, the selected mesh-element-face having a respective normal;
    specifying an angle; and
    detecting mesh-element-faces each with a respective normal, wherein the respective normal of each detected mesh-element-face intersects the respective normal of the selected mesh-element-face at an angle less than the specified angle, the detected mesh-faces representing the geometric face to be generated.

9. The method of claim 1 further comprising:
    importing the finite element mesh.

10. The method of claim 1 wherein selecting one mesh-element-face on the finite element mesh for each geometric face of a geometric object comprises:
    selecting a node, an edge, and/or a mesh-element-face.

11. A system for generating a computer-aided design (CAD) model of a real-world object from a finite element mesh, the CAD model employed in finite element simulations of the real-world object and the system comprising:
    an interface configured to allow a user to select one mesh-element-face on a finite element mesh for each respective geometric face of a geometric object, the finite element mesh representing the geometric object to be formed of each respective geometric face wherein, the geometric object represents the real-world object and each user selected mesh-element-face corresponds to a different respective geometric face of the geometric object and each different respective geometric face is represented by a plurality of respective mesh-element-faces;

a geometry generation module configured to:

generate geometric faces from each user selected mesh-element-face, including, for a given geometric face, detecting the plurality of respective mesh-element-faces that represent the given geometric face to be generated from the user selected one mesh-element-face;

stitch together the generated geometric faces to make a geometric shell of the geometric object representing the real-world object; and perform a finite element simulation using the geometric shell to determine behavior of the real-world object.

12. The system of claim 11 wherein the geometry generation module is further configured to convert the geometric shell into a solid geometric model and further comprising:

a mesh generation module configured to generate a finite element mesh from the solid geometric model.

13. The system of claim 11 wherein the geometry generation module is further configured to:

determine respective geometric surfaces corresponding to each selected mesh-element-face;

identify bounding edges of each geometric face to be generated using each selected mesh-element-face and the finite element mesh; and generate each geometric face using the determined geometric surfaces and identified bounding edges.

14. The system of claim 13 wherein each determined geometric surface is a non-analytical geometric surface or an analytical geometric surface, wherein an analytical geometric surface has a type which is one of: a plane, a cone, a cylinder, a sphere, and a torus.

15. The system of claim 11 further configured to:

allow a user to select one or more mesh-element-faces for a geometric face to be generated; and detect neighboring mesh-element-faces of the selected one or more mesh-element-faces that represent the geometric face to be generated.

16. The system of claim 11 further configured to:

allow a user to select one or more mesh-element-faces for a geometric face to be generated; and allow a user to specify a number of mesh-element-face layers surrounding the selected one or more mesh-element-faces that represent the geometric face to be generated.

17. The system of claim 11 further configured to:

allow a user to select a mesh-element-face for a geometric face to be generated, the selected mesh-element-face having a respective normal;

allow a user to specify an angle; and detect neighboring mesh-element-faces, each with a respective normal, starting from the selected mesh-element-face, wherein the respective normal of each detected mesh-element-face intersects the respective normal of adjacent mesh-element-faces at an angle less than the specified angle, the detected mesh-element-faces representing the geometric face to be generated.

18. The system of claim 11 further configured to:

allow a user to select a mesh-element-face for a geometric face to be generated, the selected mesh-element-face having a respective normal;

allow a user to specify an angle; and detect mesh-element-faces each with a respective normal, wherein the respective normal of the selected mesh-element-face intersects the respective normal of each detected mesh-element-face at an angle less than the specified angle, the detected mesh-element-faces representing the geometric face to be generated.

19. The system of claim 11 wherein the interface is configured to allow a user to select each mesh-element-face on the finite element mesh for each geometric face of a geometric object by selecting a node, an edge, and/or a mesh-element-face.

20. A computer program product generating a computer-aided design (CAD) model of a real-world object from a finite element mesh, the CAD model employed in finite element simulations of the real-world object, the computer program product executed by a server in communication across a network with one or more clients and comprising:

a non-transitory computer readable medium, the computer readable medium comprising program instructions which, when executed by a processor causes:

selecting one mesh-element-face on a finite element mesh for each respective geometric face of a geometric object, the finite element mesh representing the geometric object to be formed of each respective geometric face wherein, the geometric object represents the real-world object and each selected mesh-element-face corresponds to a different respective geometric face of the geometric object and each different respective geometric face is represented by a plurality of respective mesh-element-cells faces;

in response to selecting one mesh-element-face for each respective geometric face, generating geometric faces, including, for a given geometric face, detecting the plurality of respective mesh-element-faces that represent the given geometric face to be generated from the selected one mesh-element-face;

stitching together the generated geometric faces to make a geometric shell of the geometric object representing the real-world object; and performing a finite element simulation using the geometric shell to determine behavior of the real-world object.

* * * * *

UNITED STATES PATENT AND TRADEMARK OFFICE
CERTIFICATE OF CORRECTION

PATENT NO. : 10,943,037 B2
APPLICATION NO. : 14/765425
DATED : March 9, 2021
INVENTOR(S) : Manish Chauhan et al.

It is certified that error appears in the above-identified patent and that said Letters Patent is hereby corrected as shown below:

In the Claims

In Claim 7, Column 14, Line 41, delete "cells" and insert --faces--

In Claim 8, Column 14, Line 53, delete "mesh-faces" and insert --mesh-element-faces--

In Claim 20, Column 16, Line 44, delete "cells"

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*